United States Patent [19]

Terazono

[11] Patent Number: 4,714,824
[45] Date of Patent: Dec. 22, 1987

[54] PHOTOELECTRIC TRANSDUCER WITH ADJUSTABLE SENSITIVITY TO INCIDENT LIGHT WAVELENGTH

[75] Inventor: Shinichi Terazono, Itami, Japan

[73] Assignee: Mitsubishi Denki Kabushiki Kaisha, Tokyo, Japan

[21] Appl. No.: 848,564

[22] Filed: Apr. 7, 1986

[30] Foreign Application Priority Data

Apr. 16, 1985 [JP] Japan .................................. 60-83018

[51] Int. Cl.⁴ .............................................. H01J 40/14
[52] U.S. Cl. .............................. 250/211 R; 250/211 J
[58] Field of Search ................ 250/211 R, 211 J, 226; 357/2, 30

[56] References Cited

U.S. PATENT DOCUMENTS 3,412,252 11/1968 Grimmeiss ........................ 250/211 J
3,415,996 12/1968 Grimmeiss ........................ 250/211 J
3,430,050 2/1969 Grimmeiss ........................ 250/211 J
3,470,379 9/1969 Grimmeiss ........................ 250/211 R Primary Examiner—David C. Nelms
Assistant Examiner—Stephone B. Allen
Attorney, Agent, or Firm—Lowe, Price, LeBlanc, Becker & Shur

[57] ABSTRACT

A photoelectric transducer is composed of a photosensitive element 12 and an auxiliary light source 14. In a preferred embodiment, the photosensitive element 12 has an upper transparent electrode 6, a lower transparent electrode 7, a amorphous silicon germanium semiconductor 8, and an transparent glass substrate 11. Incident light 15 irradiates an upper light-receiving surface 9 of the amorphous silicon germanium semiconductor 8 through the upper transparent electrode 6, and the photoelectric current generated by photoelectric conversion at the amorphous silicon germanium semiconductor 8 flows through by the upper transparent electrode 6 and the lower transparent electrode 7. In one embodiment of the invention, the auxiliary light source 14 is a blue light source provided by the right side of the upper transparent electrode 6 to irradiate the photosensitive element 12, which enables selective amplification of the sensitivity of the photoelectric transducer to the incident light in the near infrared region. Furthermore, the amplication factor of the photoelectric current can be changed freely by changing the brightness of the light from the auxiliary light source 14.

20 Claims, 5 Drawing Figures

PHOTOELECTRIC TRANSDUCER WITH ADJUSTABLE SENSITIVITY TO INCIDENT LIGHT WAVELENGTH

BACKGROUND OF THE INVENTION

1. Field of the Invention

The present invention relates to a photoelectric transducer, and particularly to a photoelectric transducer comprising a photosensitive element formed of an amorphous semiconductor and an auxiliary light source, which permits an increased size and free selection of its form, and in which the region of the wavelength to which the transducer is sensitive as well as the amplification factor of the photoelectric current can also be changed.

2. Description of the Prior Art

A conventional photodiode is generally recognized as a photoelectric transducer. FIG. 1 is a schematic diagram of a photo-detecting circuit using a conventional photodiode as a photoelectric transducer. The structure of the photo detecting circuit of FIG. 1 will now be described.

Referring to FIG. 1, a photodiode 1 comprises an anode, a cathode, and a single crystal semiconductor having a pn junction provided between and in contact with, these electrodes. This single crystal semiconductor generates photoelectric current by the photoelectric conversion of the incident switching light 2. The anode of the photodiode 1 is connected to the negative terminal of the DC power source 3, while the cathode of the photodiode 1 is connected through a resistor 4 and an ampere meter 5 to the positive terminal of the DC power source 3.

The operation of a conventional photo detecting circuit of FIG. 1 is as follows. When the switching light 2 irradiates the photodiode 1, the light is converted into electricity by the photodiode 1, and the resulting photoelectric current is read by the ampere meter 5 to carry out the photo detection.

In a conventional photodiode, a single crystal semiconductor is used as a photosensitive element, but this photosensitive element itself is of small size, and therefore, it restricts the form and size of the photodiode itself. Furthermore, the photosensitive element formed of such a single crystal semiconductor is sensitive to a wide range of wavelengths, so that if the transducer is desired to be sensitive only to a specific wavelength, e.g. a near infrared light, the switching light which irradiates the photodiode must be split beforehand, e.g., by a filter. In addition, a conventional photodiode has a problem in that the amplification factor of the photoelectric current cannot be readily changed since it is defined by the photosensitive element itself.

SUMMARY OF THE INVENTION

Briefly stated, this invention comprises a photoelectric transducer composed of at least one photosensitive element and an auxiliary light source to irradiate this photosensitive element, in which the photosensitive element comprises first and second electrodes provided spaced apart from each other, and an amorphous semiconductor provided between these electrodes. At least one of said first and second electrodes is transparent and transmits the incident light, said amorphous semiconductor carries out the photoelectric conversion upon receiving said incident light, and said auxiliary light source is provided at the side of said transparent electrode.

Therefore, a primary object of this invention is to provide a photoelectric transducer of which the form and size can be selected freely.

Another object of this invention is to provide a photoelectric transducer, in which the region of the wavelength to which the photosensitive element is sensitive can be selected easily.

Yet another object of this invention is to provide a photoelectric transducer in which the amplification factor of the photoelectric current can be changed easily.

The primary advantage of the present invention is that the construction of a photosensitive element of increased area and a free selection of its form are made possible by use of an amorphous semiconductor made by chemical vapor deposition as a photosensitive material since apparatus for production of amorphous semiconductor is readily available.

Another advantage of this invention is that the range of wavelengths to which the photosensitive element is sensitive can be selected by selecting the wavelength of the auxiliary light source.

A further advantage of this invention is that the amplification factor of the photoelectric current can be changed by selecting the brightness of the light from the auxiliary light source.

These and other objects, features, and advantages of this invention will become more apparent from the following description of the preferred embodiments taken with the accompanying drawings.

DESCRIPTION OF THE PREFERRED EMBODIMENTS

Figure 2:
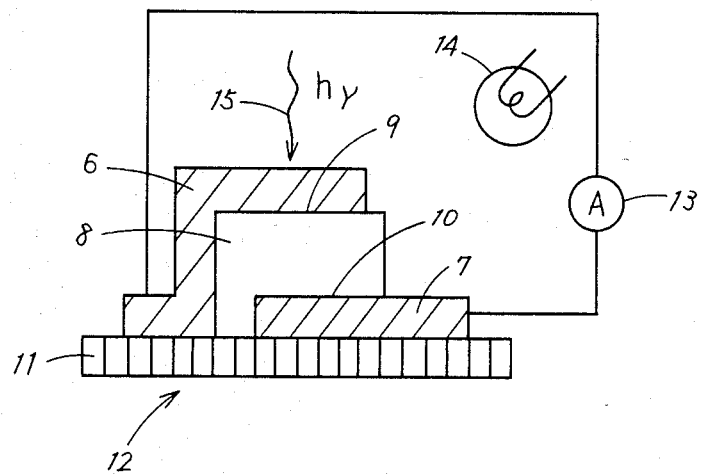
FIG. 2 is a schematic diagram of a photo-detecting circuit using a photoelectric transducer according to a preferred embodiment of this invention.

FIG. 2 is a schematic diagram of a photo-detecting circuit using a photoelectric transducer according to a preferred embodiment of this invention. The structure of the circuit of FIG. 2 will now be described.

As best seen in FIG. 2, an amorphous silicon germanium semiconductor 8 having a pin structure is provided between the upper transparent electrode 6 and a lower transparent electrode 7. The upper transparent electrode 6 and the lower transparent electrode 7 are formed of an alloy of $SnO_2$ and $InO_2$, or of a transparent oxide conductive film mainly composed of $SnO_2$.

The amorphous silicon germanium semiconductor 8 comprises an upper light receiving surface 9 and a lower receiving surface 10, and it generates the photoelectric current by the photoelectric conversion of the incident light applied through the transparent electrode 6 or 7. The generated photoelectric current is withdrawn by the transparent electrodes 6 and 7.

The upper transparent electrode 6, the amorphous silicon germanium semiconductor 8, and the lower transparent electrode 7 are mounted on a transparent glass substrate 11 integral with one another to form a photosensitive element 12. The upper transparent electrode 6 is connected to the lower transparent electrode 7 through an ampere meter 13. In addition, an auxiliary light source 14 is provided in the right side above the upper transparent electrode 6 (as best seen in FIG. 2) to irradiate the photosensitive element 12.

Figure 1:
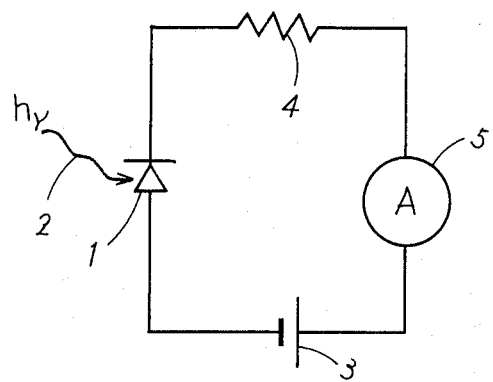
FIG. 1 is a schematic diagram of a photo-detecting circuit using a conventional photodiode.

The photo detecting circuit of FIG. 1, using a conventional photodiode, comprises a DC power source 3, while the embodiment of FIG. 2 does not include such a DC power source, as it requires no external power source, since the pin structure of the amorphous silicon germanium semiconductor 8 has a power source in its own structure. An external power source is required, however, in another embodiment, using an amorphous semiconductor having a double Shottky diode as a photosensitive element.

Figure 3:
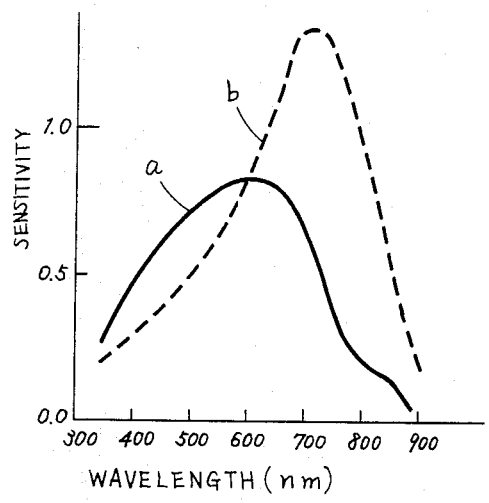
FIG. 3 is a graph illustrating the dependence on wavelength of the sensitivity of the photoelectric transducer according to an embodiment of this invention, using a blue auxiliary light source.
Figure 4:
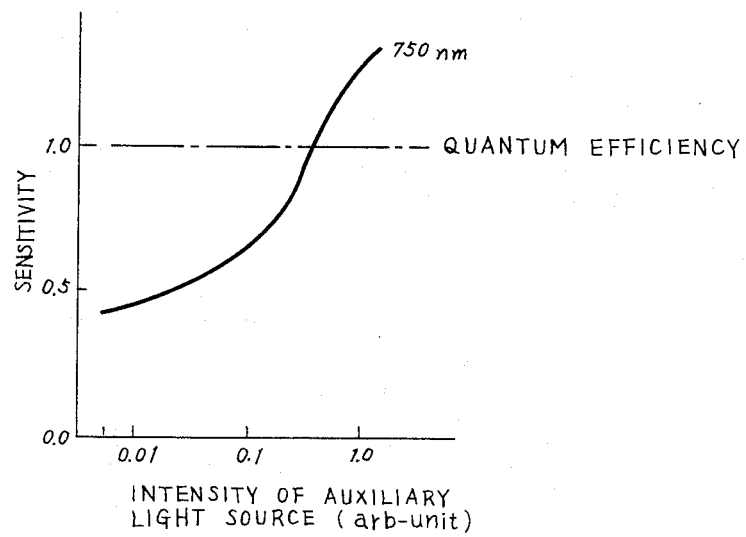
FIG. 4 is a graph illustrating the dependence on the intensity of the auxiliary light source of the sensitivity to 750 nm wavelength light, of the photoelectric transducer according to one embodiment of this invention using a blue auxiliary light source.

FIGS. 3 and 4 are graphs showing the operation of the circuit of FIG. 2. The operation of one embodiment of this invention will be hereinafter described with reference to FIGS. 2–4.

Referring to FIG. 2, switching light 15, which is the source of incident light, irradiates photosensitive element 12 from the side of the upper transparent electrode 6. The auxiliary light source 14 for the present discussion is assumed to be a blue light source. When the light from the auxiliary light source 14 irradiates the photosensitive element 12, the light is introduced to the amorphous silicon germanium semiconductor 8. When the switching light 15 irradiates the photosensitive element 12 in this state, the switching light penetrates the upper transparent electrode 6 to be introduced to the amorphous silicon germanium semiconductor 8 through the upper light receiving surface 9. These beams of incident light are photoelectrically converted by the amorphous silicon germanium semiconductor 8, and the resulting photoelectric current is read by the ampere meter 13, and thus the photo detection is carried out.

The amorphous semiconductor such as the amorphous silicon germanium semiconductor, is readily formed by a chemical vapor deposition technique and the manufacturing apparatus thereof having a relatively large size can be easily implemented to produce sizable amorphous silicon germanium semiconductors. Therefore, as compared with a photosensitive element using a conventional single crystal semiconductor having a pn junction, the photosensitive element using an amorphous semiconductor, as discussed above, can have a larger area, and the form of the photosensitive element can be selected freely.

FIG. 3 is a graph showing the dependence on wavelength of the sensitivity of the photoelectric transducer of FIG. 2 using a blue auxiliary light source. In FIG. 3, the abscissa represents the wavelength of the incident light, and the ordinate represents the sensitivity of the photoelectric transducer. In this figure, the solid line "a" corresponds to the case where there is no auxiliary light source, and the dotted line "b" corresponds to the case where there is a blue auxiliary light source. As shown by the dotted line b, in the case where blue light is used as an auxiliary light source, sufficient photoelectric current cannot be obtained when the blue light as the switching light 15 irradiates the photosensitive element 12, and sufficient photoelectric current is obtained only when near-infrared light irradiates the photosensitive element 12. This is due to a reduction of the sensitivity of the photosensitive element 12 in the short wavelength region, caused by the blue light emitted from the blue auxiliary light source. This means that blue light restricts the region of the wavelength to which the photosensitive element is sensitive. Therefore, in a photoelectric transducer according to the embodiment of FIG. 2, the sensitivity of the photosensitive element in the near-infrared region can be selectively amplified.

FIG. 4 is a graph showing the dependence on the intensity of the auxiliary light source of the sensitivity to 750 nm wavelength light, of the photoelectric transducer of FIG. 2 using a blue auxiliary light source. In FIG. 4, the abscissa represents the intensity of the auxiliary light source, and the ordinate represents the sensitivity of the photoelectric transducer. Although "the intensity of the auxiliary light source" means the same as "the illuminance of the auxiliary light source", the value of the intensity in FIG. 4 is of arbitrary scale and does not correspond to the measured actual value of the illuminance. Meanwhile, FIG. 3 shows the sensitivity of the photoelectric transducer to each wavelength, when the intensity of the auxiliary light source is set at 1.0.

The significance of the sensitivity or the quantum efficiency will now be described. Light may be considered to be an aggregation of photons having energy. When the light irradiates a semiconductor, if one photon is required to generate one electron, the quantum efficiency is 1.0, and if two photons are required, the quantum efficiency is 0.5. Accordingly, the quantum efficiency is defined as the inverse of the number of the photons required to generate one electron. As shown in FIG. 4, in the case where a blue light source is used as the auxiliary light source, the sensitivity of the photoelectric transducer to the switching light 15 of 750 nm wavelength can be increased by increasing the intensity of the blue light source. Particularly, in FIG. 4, if the intensity of the auxiliary light source is further increased to more than 1.0, the corresponding sensitivity increases apparently in proportion to the intensity. Accordingly, the amplification factor of the photoelectric current can be changed freely in the photoelectric transducer according to the embodiment of FIG. 2.

Figure 5:
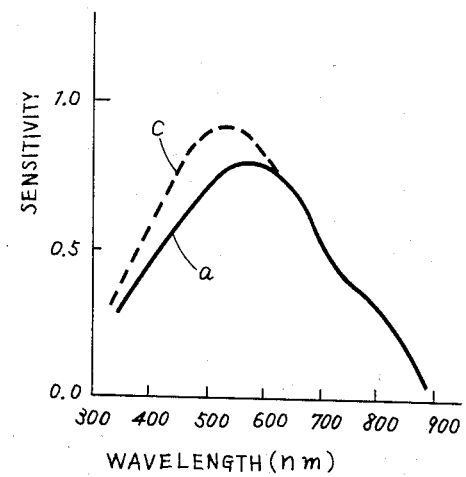
FIG. 5 is a graph illustrating the dependence on wavelength of the sensitivity of the photoelectric transducer according to an embodiment of this invention, using a red auxiliary light source.

FIG. 5 is a graph showing the dependence on wavelength of the sensitivity of the photoelectric transducer according to another embodiment of this invention, using a red light source as the auxiliary light source 14. In FIG. 5, the abscissa and the ordinate represent, as in FIG. 3, the wavelength of the incident light and the sensitivity of the photoelectric transducer, respectively. In FIG. 5, the solid line a corresponds to the case where there is no auxiliary light source, while the dotted line "c" corresponds to the case where there is an auxiliary light source of red light. As shown by the dotted line c, when the red light source is used as the auxiliary light source, the sensitivity can be selectively amplified in the region of 400 nm to 600 nm wavelength, whereby a photoelectric transducer sensitive to regions of wavelength different from that of the previously described case using a blue auxiliary light source can be obtained.

The auxiliary light source 14 may be made switchable between a plurality of colors, e.g. blue and red. To do this, the auxiliary light source 14 may be provided with a filter or a LED capable of emitting light of changing color may be used as the auxiliary light source 14.

Although the auxiliary light source 14 was provided in the right side above the upper transparent electrode 6 in the above embodiment, (as best seen in FIG. 2) the auxiliary light source 14 may be provided by the side of, or below, the transparent glass substrate 11 to obtain the same effect as in the above embodiment.

In addition, although only one photosensitive element was employed in the discussed embodiments, the present invention can be applied to a two-dimensional array device having a plurality of photosensitive elements arranged in matrix form.

Although a photosensitive element having a pin structure was employed in the above discussed embodiments, an element having a Shottky diode structure may be used to obtain the same effect.

Furthermore, although the photosensitive element was formed of an amorphous silicon germanium semiconductor in the above embodiment, it may be formed of an amorphous silicon semiconductor to obtain the same effect as in the above embodiment.

Although the present invention has been described with reference to specific embodiments, it should be understood that these embodiments are only exemplary preferred embodiments and that modifications may be made without departing from the scope of the invention as defined in the appended claims.

What is claimed is:

1. A photoelectric tranducer, comprising:
    at least one photosensitive element, said photosensitive element including first and second electrodes provided spaced apart from each other, at least one of said first and second electrodes being transparent to transmit incident light, said element further including an amorphous semiconductor provided between and in contact with said first and second electrodes for performing photoelectric conversion upon receipt of said incident light; and,
    an auxiliary light source provided by a side of said transparent electrode for irradiating said photosensitive element.

2. A photoelectric transducer according to claim 1, wherein said transparent electrode is formed of an alloy of $SnO_2$ and $InO_2$.

3. A photoelectric transducer according to claim 1, wherein said amorphous semiconductor is an amorphous silicon semiconductor.

4. A photoelectric transducer according to claim 1, wherein said amorphous semiconductor is an amorphous silicon germanium semiconductor.

5. A photoelectric transducer according to claim 1, wherein said amorphous semiconductor has a pin structure.

6. A photoelectric transducer according to claim 1, wherein said amorphous semiconductor has a Shottky diode structure.

7. A photoelectric transducer according to claim 1, further comprising a transparent glass substrate on which said first and second electrodes and said amorphous semiconductor are formed integrally.

8. A photoelectric transducer according to claim 1, wherein:
    said first and second electrodes are both transparent;
    said incident light irradiates said photosensitive element from a side of said first electrode; and
    said auxiliary light source is provided by a side of said first electrode.

9. A photoelectric transducer according to claim 1, wherein:
    said first and second electrodes are both transparent;
    said incident light irradiates said photosensitive element from a side of said first electrode; and
    said auxiliary light source is provided by a side of said second electrode.

10. A photoelectric transducer according to claim 1, wherein said auxiliary light source is a blue light source.

11. A photoelectric transducer according to claim 1, wherein said auxiliary light source is a red light source.

12. A photoelectric transducer according to claim 1, wherein said auxiliary light source comprises means for providing light selectable from a plurality of colors.

13. A photoelectric transducer according to claim 12, wherein said auxiliary light source comprises a filter operable for switching among said plurality of colors.

14. A photoelectric transducer according to claim 12, wherein said auxiliary light source comprises a plurality of light emitting diodes each capable of providing light of a different color, operable to provide a selection of light emission colors.

15. A photoelectric transducer according to claim 1, wherein said transparent electrode is formed of a transparent oxide conductive film substantially composed of $SnO_2$.

16. A photoelectric transducer according to claim 8, wherein said auxiliary light source comprises means for providing light selectable from a plurality of colors.

17. A photoelectric transducer according to claim 16, wherein said auxiliary light source comprises a plurality of light emitting diodes each capable of providing light of a different color, operable to provide a selection of light emission colors.

18. A photoelectric transducer according to claim 9, wherein said auxiliary light source comprises means for providing light selectable from a plurality of colors.

19. A photoelectric transducer according to claim 18, wherein said auxiliary light source comprises a plurality of light emitting diodes each capable of providing light of a different color, operable to provide a selection of light emission colors.

20. A photoelectric transducer according to claim 1, wherein said auxiliary light source comprises a filter operable for switching among said plurality of colors.

* * * * *